(12) United States Patent
Sugiura et al.

(10) Patent No.: US 10,596,618 B2
(45) Date of Patent: Mar. 24, 2020

(54) METHOD FOR PRODUCING HEAT SINK

(71) Applicants: Naoaki Sugiura, Takahama (JP);
Yuichi Furukawa, Toyota (JP);
Mitsuhiro Kobayashi, Kariya (JP);
Fumio Kawahara, Toyota (JP);
Katsuhiro Takami, Toyota (JP)

(72) Inventors: Naoaki Sugiura, Takahama (JP);
Yuichi Furukawa, Toyota (JP);
Mitsuhiro Kobayashi, Kariya (JP);
Fumio Kawahara, Toyota (JP);
Katsuhiro Takami, Toyota (JP)

(73) Assignees: TOYOTA JIDOSHA KABUSHIKI KAISHA, Toyota-shi (JP); MEC International Co., Ltd., Toyota-shi (JP)

( * ) Notice: Subject to any disclaimer, the term of this patent is extended or adjusted under 35 U.S.C. 154(b) by 175 days.

(21) Appl. No.: 15/684,333

(22) Filed: Aug. 23, 2017

(65) Prior Publication Data

US 2018/0056363 A1 Mar. 1, 2018

(30) Foreign Application Priority Data

Aug. 24, 2016 (JP) .................. 2016/163605

(51) Int. Cl.
*B21D 53/04* (2006.01)
*B22D 17/00* (2006.01)
(Continued)

(52) U.S. Cl.
CPC ............. *B21D 53/04* (2013.01); *B22D 17/00* (2013.01); *B23P 15/26* (2013.01); *F28F 3/02* (2013.01);
(Continued)

(58) Field of Classification Search
CPC . B21D 53/04; B22D 17/00; F28F 3/02; B23P 15/26; Y10T 29/49984
See application file for complete search history.

(56) References Cited

U.S. PATENT DOCUMENTS 5,215,140 A * 6/1993 Beane ................. B22D 18/06
164/63
5,388,631 A * 2/1995 Suganuma ......... B22D 17/2038
164/113
(Continued)

FOREIGN PATENT DOCUMENTS

EP      2 489 448 A1      8/2012
EP      2489448  B1 * 12/2013 ........... B23K 1/0012
(Continued)

OTHER PUBLICATIONS

"Resodyn", Resodyn Coatings. Innovative Coating Technologies for Industry, Feb. 18, 2015, p. 1 (All), <http://resodyncoatings.com/products-portable-powder-coating/> (Year: 2015).*
(Continued)

*Primary Examiner* — Jacob J Cigna
*Assistant Examiner* — Michael W Hotchkiss
(74) *Attorney, Agent, or Firm* — Oblon, McClelland, Maier & Neustadt, L.L.P.

(57) ABSTRACT

Provided is a method for producing a heat sink that can easily and effectively form a heat radiating film on the surface of a substrate without requiring enormous heat energy for increasing the temperature of the substrate. The method is a method for producing a heat sink having a substrate and a heat radiating film formed on the surface of the substrate, including a first step of casting a substrate by injecting molten metal into a cavity of molding dies; and a second step of applying a heat radiating coating to the substrate through spraying or dropping in the period from when the molding dies are opened after the casting until
(Continued)

when the temperature of the substrate that has been cast becomes lower than the deposition temperature that is a temperature necessary to deposit the heat radiating coating on the substrate.

7 Claims, 10 Drawing Sheets

(51) Int. Cl.
| | |
|---|---|
| *B23P 15/26* | (2006.01) |
| *F28F 3/02* | (2006.01) |
| *F28F 13/18* | (2006.01) |
| *F28F 21/06* | (2006.01) |
| *B05D 1/02* | (2006.01) |
| *B05D 3/02* | (2006.01) |
| *B05D 7/14* | (2006.01) |
| *H05K 7/20* | (2006.01) |

(52) U.S. Cl.
CPC ............ *F28F 13/18* (2013.01); *F28F 21/065* (2013.01); *B05D 1/02* (2013.01); *B05D 3/0218* (2013.01); *B05D 7/14* (2013.01); *B05D 2202/25* (2013.01); *B05D 2505/00* (2013.01); *B05D 2505/50* (2013.01); *B23P 2700/10* (2013.01); *H05K 7/2039* (2013.01)

(56) References Cited

U.S. PATENT DOCUMENTS

| | | | |
|---|---|---|---|
| 5,714,206 A * | 2/1998 | Daly | B05D 1/06 427/195 |
| 6,085,830 A * | 7/2000 | Mashiko | B22D 17/24 165/185 |
| 6,516,867 B1 * | 2/2003 | Ootori | B22D 17/002 164/137 |
| 9,669,459 B2 * | 6/2017 | Guthrie | B22D 29/00 |
| 2003/0172769 A1 * | 9/2003 | Ito | B29C 37/0032 74/552 |
| 2007/0259119 A1 * | 11/2007 | Shen | B05D 5/00 427/372.2 |
| 2010/0206527 A1 * | 8/2010 | Hu | C09D 7/70 165/133 |
| 2013/0180688 A1 * | 7/2013 | Lin | B22D 17/00 165/104.26 |
| 2016/0010843 A1 | 1/2016 | Hattori et al. | |
| 2016/0338228 A1 | 11/2016 | Suzuki et al. | |

FOREIGN PATENT DOCUMENTS

| | | | |
|---|---|---|---|
| GB | 961024 A | 6/1964 | |
| JP | 48-101427 A | 12/1973 | |
| JP | 48-101429 A | 12/1973 | |
| JP | 57-202683 | 12/1982 | |
| JP | 2002-322567 A | 11/2002 | |
| JP | 2004-140031 A | 5/2004 | |
| JP | 2004140031 A * | 5/2004 | |
| JP | 2009-152537 | 7/2009 | |
| JP | 2014-209459 | 11/2014 | |
| WO | WO-2005097389 A1 * | 10/2005 | ........... B23K 1/0012 |
| WO | WO 2015/111242 A1 | 7/2015 | |

OTHER PUBLICATIONS

Machine Translation of JP2004140031A (Year: 2004).*
Japanese Office Action dated Sep. 25, 2018 in Japanese Patent Application No. 2016-163605 (with English translation), citing documents AO, AP and AQ therein, 6 pages.

* cited by examiner

METHOD FOR PRODUCING HEAT SINK

CROSS REFERENCE TO RELATED APPLICATIONS

The present application claims priority from Japanese patent application JP 2016-163605 filed on Aug. 24, 2016, the content of which is hereby incorporated by reference into this application.

BACKGROUND

Technical Field

The present disclosure relates to a method for producing a heat sink that has a substrate and a heat radiating film formed on the surface thereof.

Background Art

Nowadays, electric circuits have been produced in a more compact size, and heat generation density has increased correspondingly. Therefore, an improvement in the heat radiation performance of electric circuits is one of the important challenges to be achieved.

An electric circuit with a large amount of heat generation has a housing, which is typically produced through aluminum die casting, for storing the electric circuit therein. However, although the thermal conductivity of metal is high, the rate of heat transfer of metal to the air tends to be low. For example, aluminum has a thermal conductivity of 100 W/mK, but has a rate of heat transfer (emissivity) to the air as low as about 0.1 to 0.3.

Herein, various attempts have been made to form a film of carbon, nitride, resin, or the like, which is a material with a high rate of heat transfer to the air, on the surface of a metal housing.

By the way, a heat sink is produced by casting a substrate using molding dies, taking the substrate out of the molding dies, transferring the substrate to a place where a coating operation is to be performed, and injecting resin onto the surface of the substrate, for example, to form a film thereon.

For example, JP S57-202683 A discloses a method for producing a heat radiating base for an electric heater, including die casting a substrate for the heat radiating base, and forming a resin covering layer on a surface to radiate heat of the substrate through resin injection molding using a mold, where the resin injection molding is performed while the substrate at a high temperature immediately after being die cast is placed in the mold.

According to the method for producing a heat radiating base for an electric heater described in JP S57-202683 A, a substrate at a high temperature immediately after being die cast is placed in a mold for resin injection molding, and a resin covering layer is formed on a surface to radiate heat of the substrate through injection of resin in such a state. Therefore, it is not necessary to additionally heat the substrate, and thus, a heat radiating base can be produced inexpensively and efficiently without using heating systems.

SUMMARY

A method for forming a covering layer on a substrate through injection molding by placing the substrate in a mold as described in JP S57-202683 A has a problem in that the step of forming the covering layer is complex and another mold for forming the covering layer is needed because the substrate is placed in the mold to perform injection molding.

A substrate that has been cast frequently has variations in the shape and dimensions. Therefore, there is a problem in that it is not easy to place such a substrate with variations in the shape and dimensions in a mold.

Further, when the method for forming a covering layer on a substrate through injection molding is used, it would be difficult to form a covering layer to a desired thickness on each portion of the substrate to be covered because the substrate is placed in the mold to perform injection molding.

In addition, when the shape of a portion of the substrate to be covered with a film is not flat and has a more complex shape as in the substrate shape of JP S57-202683 A, it becomes further difficult to form a film thereon.

The present disclosure has been made in view of the foregoing, and exemplary embodiments relate to providing a method for producing a heat sink, which includes casting a substrate using molding dies, and forming a heat radiating film on the surface of the substrate, where the heat radiating film can be easily and efficiently formed to a desired thickness on the surface of the substrate without requiring enormous heat energy for increasing the temperature of the substrate or without greatly degrading the deposition quality of the film depending on the shape of the surface.

Accordingly, the method for producing a heat sink in accordance with the present disclosure is a method for producing a heat sink having a substrate and a heat radiating film formed on a surface of the substrate, including a first step of casting a substrate by injecting molten metal into a cavity of molding dies (a first die and a second die); and a second step of applying a heat radiating coating to the substrate through spraying or dropping in a period from when the molding dies (the first die and the second die) are opened after the casting until when the temperature of the substrate that has been cast becomes lower than a deposition temperature that is a temperature necessary to deposit the heat radiating coating on the substrate.

According to the method for producing a heat sink of the present disclosure, a heat radiating coating is applied to a substrate not through a complex method like injection molding, which includes placing a substrate in a sealed mold, but through spraying or dropping. Therefore, the heat radiating coating can be applied easily and effectively. Herein, the method of applying a heat radiating coating to a substrate through spraying means applying a heat radiating coating to a substrate by spraying its coating particles from a spray nozzle or the like while allowing the coating particles to have a momentum. The method of applying a heat radiating coating to a substrate through dropping means passing a substrate below a coating that is being dropped and thus applying the coating to the substrate.

Herein, the period from when the molding dies (the first die and the second die) are opened after the casting until when the temperature of the substrate that has been cast becomes lower than the deposition temperature may be any suitable part of the time period or the entire time period.

Further, although a temperature decrease occurs during the process in which the substrate at a high temperature immediately after the molding dies (the first die and the second die) are opened is released from the molding dies or is transferred to a coating area, for example, if a heat radiating coating is applied to the substrate while the temperature of the substrate is greater than or equal to the deposition temperature that is a temperature necessary to deposit the heat radiating coating on the substrate surface through adherence or heat curing, it becomes possible to eliminate the need for enormous heat energy, which would otherwise be needed to increase the temperature of the substrate that has decreased too much, up to a temperature that is suitable for applying the coating to the substrate.

Examples of the heat radiating coating include a heat radiating coating containing thermoplastic resin and a heat radiating coating containing thermosetting resin. Specific examples of thermoplastic resin include polyamide-imide (PAI) and specific examples of thermosetting resin include epoxy coatings and phenolic coatings.

When polyamide-imide is used, the deposition temperature of the heat radiating coating means a temperature at which a solvent in which polyamide-imide is dissolved as a solute, for example, evaporates and the polyamide-imide softens due to its plasticity. Thereafter, the softened polyamide-imide cures in accordance with a temperature decrease and adheres to the substrate. Meanwhile, when thermosetting resin such as an epoxy coating or a phenolic coating is used, the deposition temperature of the heat radiating coating means the curing temperature of the thermosetting resin.

Specifically, when polyamide-imide is used as the heat radiating coating, the heat radiating coating is applied to the substrate under a temperature condition of greater than or equal to 180° C., while when an epoxy coating or a phenolic coating is used as the heat radiating coating, the heat radiating coating is applied to the substrate under a temperature condition of greater than or equal to 170° C. that is greater than or equal to the curing temperature of the heat radiating coating.

For example, as the heat of molten aluminum is at about 700° C., the temperature of the substrate immediately after being molded is greater than or equal to the aforementioned deposition temperature of the heat radiating coating. Therefore, when the heat radiating coating is applied to the substrate while the temperature of the substrate is greater than or equal to the deposition temperature of the heat radiating coating, the applied heat radiating coating adheres to or thermally cures on the substrate by the heat of the substrate, whereby a heat radiating film is formed.

As described above, when the heat radiating coating is applied to the substrate while the temperature of the substrate is greater than or equal to the deposition temperature of the heat radiating coating, the heat radiating coating can be allowed to adhere to or be cured (baked) on the substrate by the heat of the substrate. Therefore, a baking furnace that has been needed in the baking step of the production method of the related art can be omitted and the baking step can be omitted, which can increase the production efficiency.

In addition, when the heat radiating coating is applied to the substrate using a dipping method or using a brush or the like, volatile components contained in the heat radiating coating will collectively evaporate, with the result that voids become likely to be formed in the heat radiating film formed, which is problematic.

In contrast, when the heat radiating coating is applied to the substrate through spraying or dropping, evaporation of volatile components partially occurs. Therefore, voids are unlikely to be formed in the heat radiating film formed and thus, a heat radiating film with an even more uniform thickness can be formed.

In an embodiment of the method for producing a heat sink in accordance with the present disclosure, the substrate that is molded through the casting in the first step has a fin structure on its surface, and in the second step, the heat radiating coating is applied to the fin structure of the substrate through spraying or dropping.

Herein, the fin structure means a projection/recess structure having a plurality of projections that are arranged at intervals therebetween to increase the specific surface area of the substrate. When the heat radiating coating is applied to the substrate through spraying or dropping, it is possible to stably form a heat radiating film on the surface of the substrate even when the surface of the substrate is not flat and has complex projections and recesses like a fin structure as in the present embodiment. Further, as the result of the specific surface area of the heat radiating film is increased in the fin structure, a heat sink having high heat radiation performance can be produced.

In an embodiment of the method for producing a heat sink in accordance with the present disclosure, the temperature of the substrate when the heat radiating coating is applied thereto in the second step is in the range of greater than or equal to the deposition temperature of the heat radiating coating and less than a preset temperature that is higher than the deposition temperature by a predetermined temperature.

As the temperature of the aluminum substrate after the dies are opened is about 350 to 400° C., for example, if the aforementioned polyamide-imide (PAI), epoxy coating, or phenolic coating is used as the heat radiating coating, it is possible to, by applying the heat radiating coating to the substrate while the temperature of the substrate is in the range of less than +100° C. of the deposition temperature of the heat radiating coating, obtain a heat sink with high heat radiation performance with high production efficiency. Further, film deposition can be performed under a uniform deposition temperature condition for each product, and therefore, variations in the quality of the final products can be suppressed.

In an embodiment of the method for producing a heat sink of the present disclosure, the heat radiating coating contains thermosetting resin, the deposition temperature is defined as a curing temperature at which the thermosetting resin cures, and the temperature of the substrate when the heat radiating coating is applied thereto in the second step is in the range of greater than or equal to the curing temperature and less than a preset temperature that is higher than the curing temperature by a predetermined temperature.

When a heat radiating coating containing thermosetting resin is used, it is possible to, by appropriately setting the temperature of the substrate during application of the heat radiating coating thereto in the range of the curing temperature of the thermosetting resin to a preset temperature that is higher than the curing temperature by a predetermined temperature (+100° C., for example), effectively increase the production efficiency while prioritizing the deposition environment that is effective for depositing the heat radiating coating. Further, variations in the quality of the final products can be controlled even more easily.

Alternatively, in an embodiment of the method for producing a heat sink in accordance with the present disclosure, the heat radiating coating contains thermoplastic resin, the deposition temperature is defined as a softening temperature at which the thermoplastic resin softens, and the temperature of the substrate when the heat radiating coating is applied thereto in the second step is in the range of greater than or equal to the softening temperature and less than a preset temperature that is higher than the softening temperature by a predetermined temperature.

When a heat radiating coating containing thermoplastic resin is used, it is possible to, by appropriately setting the temperature of the substrate during application of the heat radiating coating thereto in the range of the softening temperature of the thermoplastic resin to a preset temperature that is higher than the softening temperature by a predetermined temperature (+100° C., for example), effectively increase the production efficiency while prioritizing the deposition environment that is effective for depositing the heat radiating coating. Further, variations in the quality of the final products can be controlled even more easily.

Further, in an embodiment of the method for producing a heat sink in accordance with the present disclosure, the surface roughness Ra of the heat radiating film formed is greater than or equal to 5 μm.

In particular, when the heat radiating coating is applied to the substrate through spraying or dropping, a heat radiating film with a surface roughness Ra as high as 5 μm or greater can be formed, and the specific surface area of the heat radiating film thus becomes large. Consequently, a heat sink with high heat radiation performance can be produced. Further, as described previously, when a method of spraying a heat radiating coating or a method of dropping a heat radiating coating is used, a heat radiating film with as uniform thickness as possible can be formed in comparison with when a deposition method such as dipping is used.

As can be understood from the foregoing description, according to the method for producing a heat sink of the present disclosure, a heat radiating coating is applied to a substrate through spraying or dropping in the period from when the molding dies are opened after the substrate has been cast with the molding dies until when the temperature of the substrate that has been cast becomes lower than the deposition temperature that is a temperature necessary to deposit the heat radiating coating on the substrate, whereby a heat radiating film can be easily and effectively formed on the surface of the substrate without requiring enormous heat energy for increasing the temperature of the substrate.

DETAILED DESCRIPTION

Hereinafter, embodiments of a method for producing a heat sink of the present disclosure will be described in conjunction with a production system, with reference to the drawings. Although the drawings illustrate examples in which a robot hand is used as means for transferring a substrate that has been released from molding dies, the transfer means may be a belt conveyer, hands of an operator, and the like besides the transfer means.

(System for Producing Heat Sink)

Figure 1:
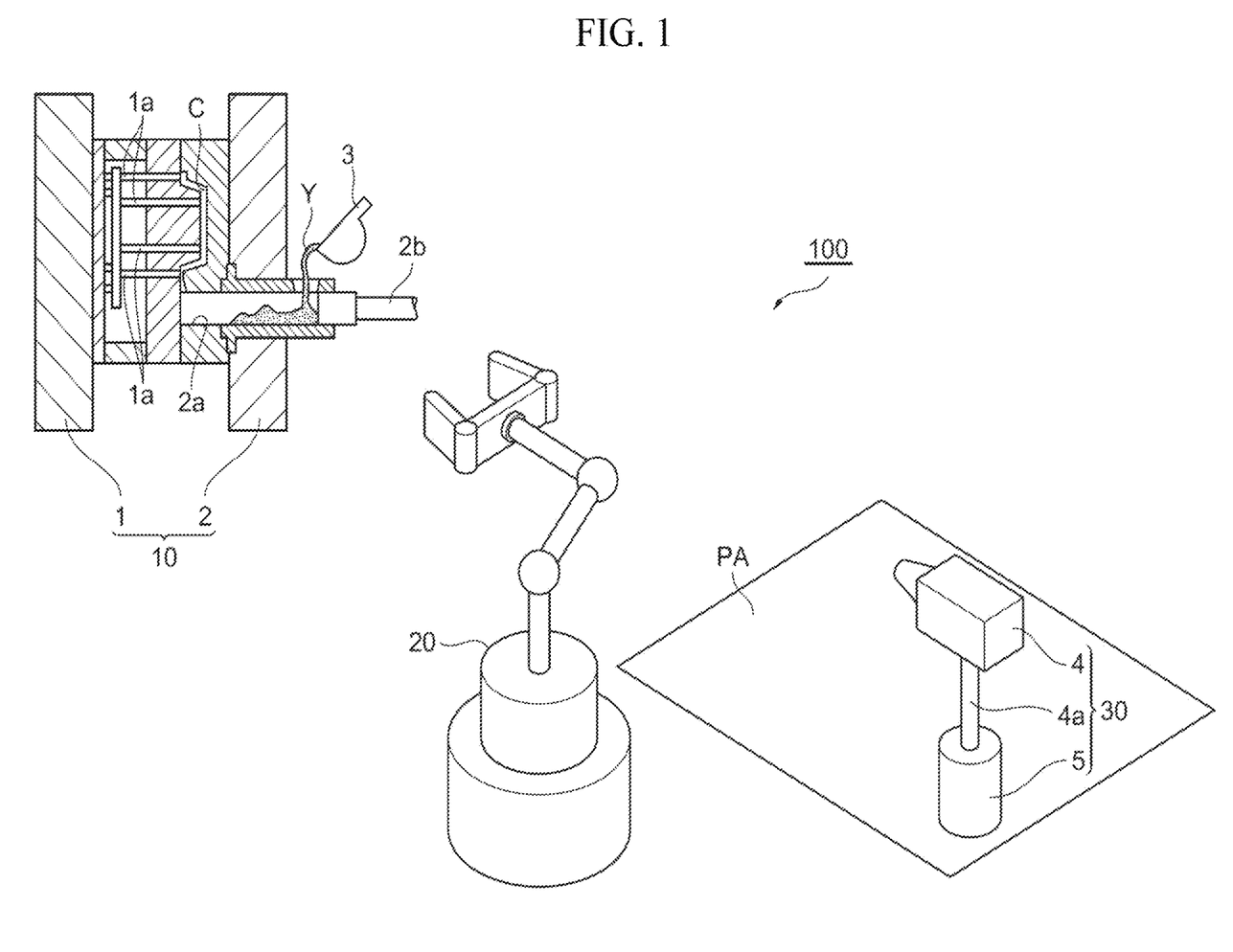
FIG. 1 is a schematic diagram illustrating an embodiment of a production system applied to the method for producing a heat sink of the present disclosure, and a first step of the production method.

FIG. 1 is a schematic diagram illustrating an embodiment of a system for producing a heat sink of the present disclosure. A production system 100 illustrated in the drawing includes molding dies 10, a transfer apparatus 20 including a robot hand, and a coating applicator 30.

The molding dies 10 include a first die 1 and a second die 2, and a cavity C is defined in a state in which the first die 1 and the second die 2 illustrated in the drawing are closed. In addition, the first die 1 incorporates therein a substrate extruder 1a, and the second die 2 incorporates therein an injection hole 2a and a molten metal extruder 2b that slides in the injection hole 2a.

Molten metal Y of aluminum or the like provided from a molten metal retaining furnace (not illustrated) is provided to a crucible 3, and the molten metal Y is flowed into the injection hole 2a via the crucible 3.

The coating applicator 30 includes a coating storage container 5 that stores therein a heat radiating coating, a spray nozzle 4, and a coating supply pipe 4a that provides the heat radiating coating to the spray nozzle 4 from the coating storage container 5.

The coating applicator 30 is disposed in a coating area PA including an open floor, and a substrate that has been cast with the molding dies 10 is transferred to the coating area PA by the robot hand 20 so that the surface of the substrate is coated with a heat radiating coating in the open coating area PA. Herein, the term "open" means that the relevant area should be distinguished from a state sealed by a mold, and the term "open coating area PA" refers to an area where a coating operation can be performed in an open state as the words suggest.

Herein, examples of the heat radiating coating include polyamide-imide (PAI), epoxy coatings, and phenolic coatings.

Next, a method for producing a heat sink using the production system 100 illustrated in FIG. 1 will be described.

(Method for Producing Heat Sink)

Figure 2:
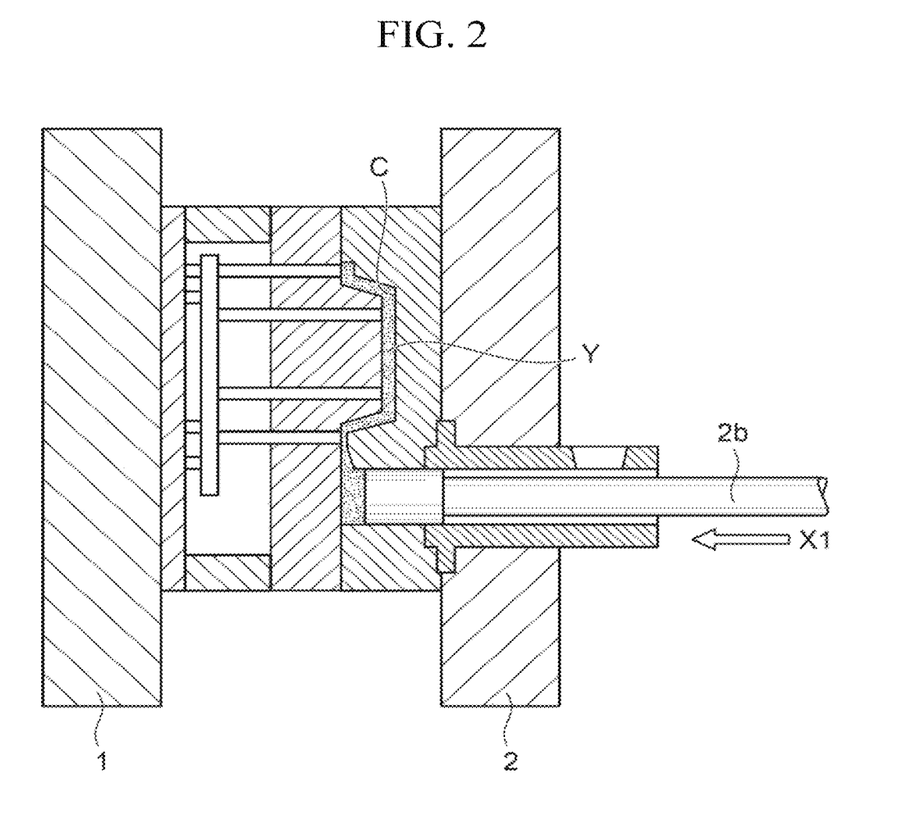
FIG. 2 is a schematic diagram illustrating the first step following FIG. 1.
Figure 3:
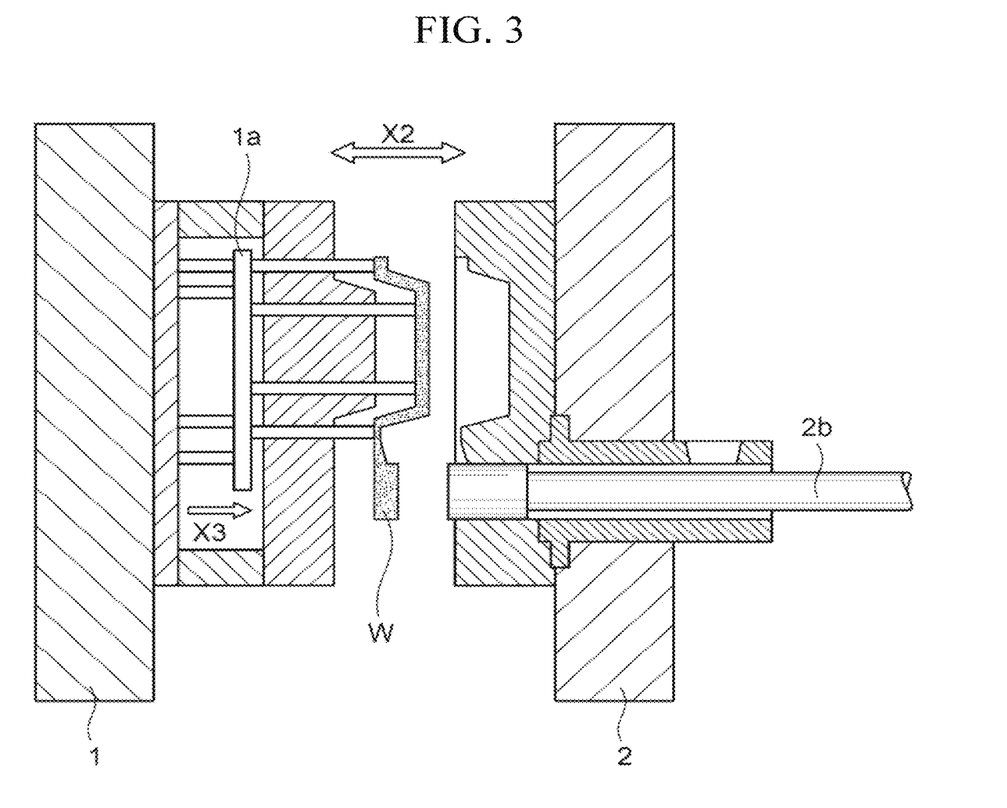
FIG. 3 is a schematic diagram illustrating a second step of the method for producing a heat sink.
Figure 4A:
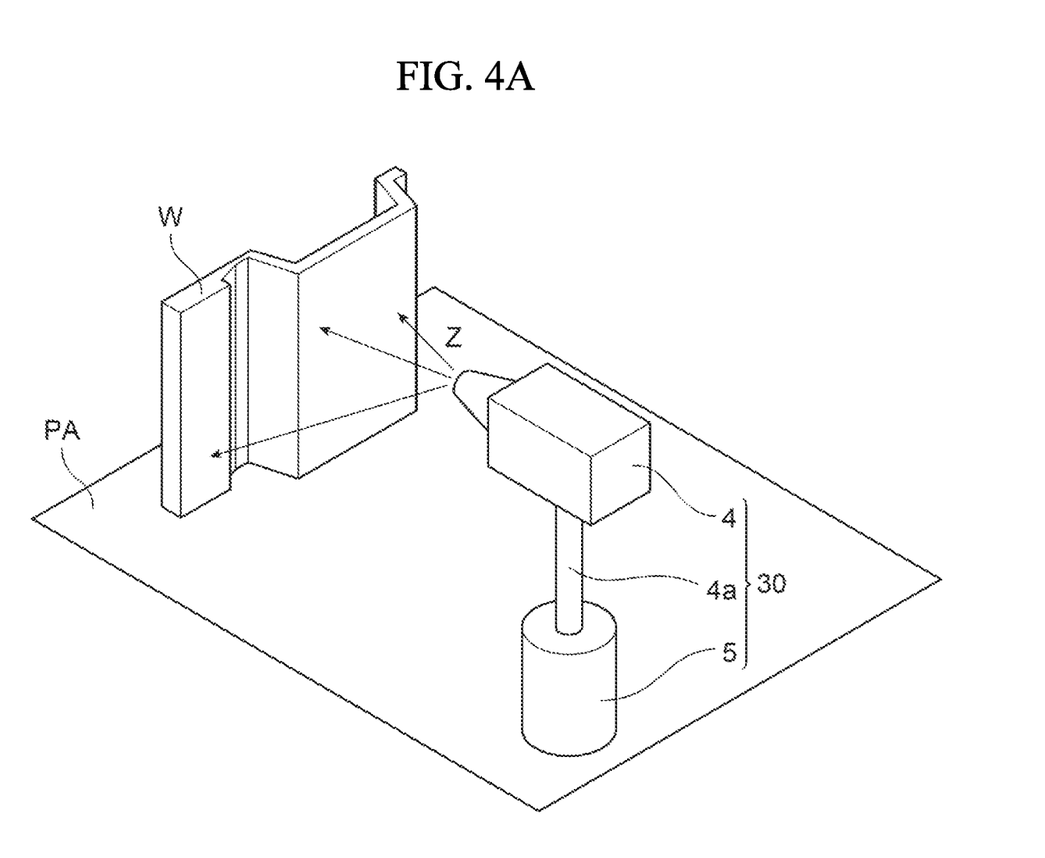
FIG. 4A is a schematic diagram of an embodiment of the heat sink illustrating the second step following FIG. 3.
Figure 4B:
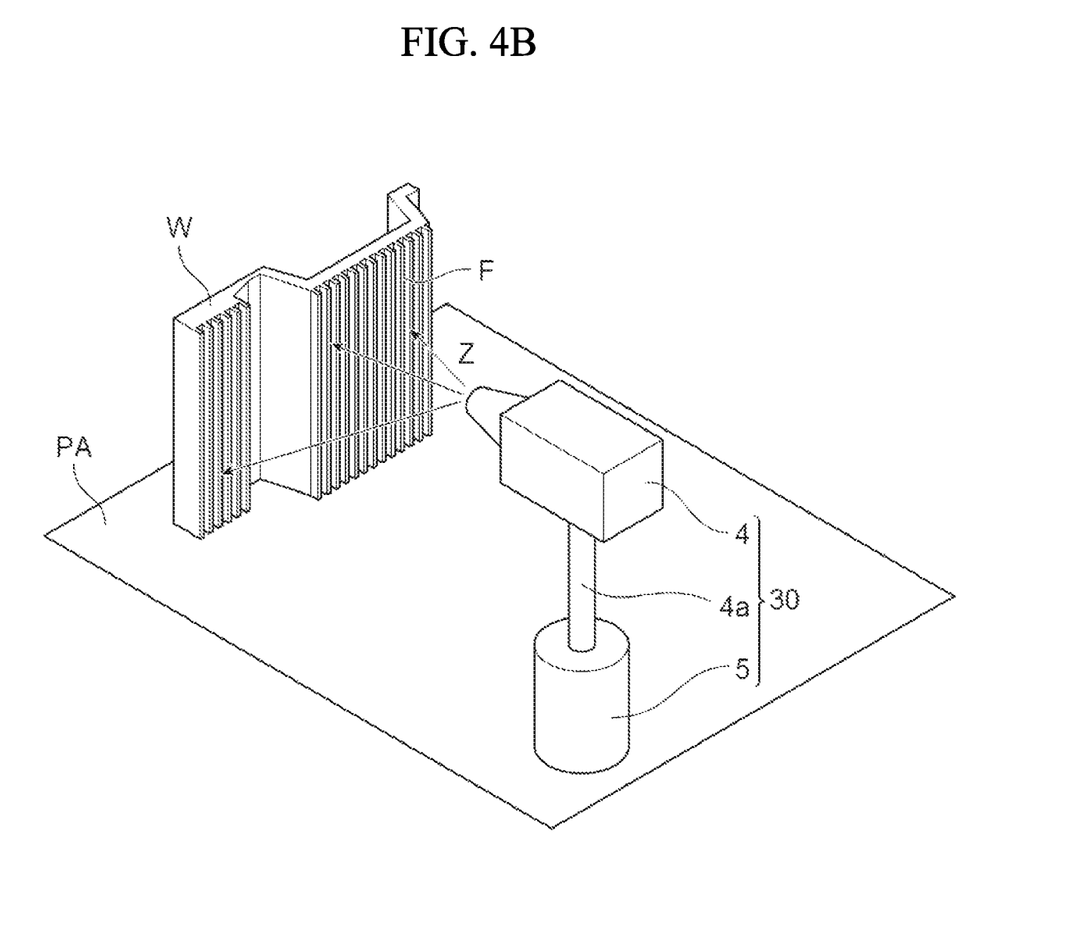
FIG. 4B is a schematic diagram of another embodiment of the heat sink illustrating the second step following FIG. 3.

FIG. 1 is a schematic diagram illustrating the aforementioned system for producing a heat sink and a first step of the method for producing a heat sink of the present disclosure. FIG. 2 is a schematic diagram illustrating the first step following FIG. 1. FIGS. 3 and 4 are schematic diagrams sequentially illustrating a second step of the method for producing a heat sink.

First, after the wall surface of the cavity C of the molding dies 10 is coated with a release agent, the molding dies 10 are closed as illustrated in FIG. 1, and molten metal Y is poured into the injection hole 2a of the second die 2 via the crucible 3. Herein, when the molten metal Y is molten aluminum, the temperature of the molten metal Y is about 700° C.

Next, as illustrated in FIG. 2, the molten metal extruder 2b is pushed (in the X1 direction) to move the molten metal Y to the cavity C side so that the molten metal is poured into the cavity C and a substrate W is cast (hereinabove is the first step).

Next, as illustrated in FIG. 3, the molding dies 10 are released (in the X2 direction), and further, the substrate extruder 1a is pushed (in the X3 direction) to extrude the cast substrate W from the molding dies 10.

The substrate W extruded from the molding dies 10 is gripped with the robot hand 20 and is transferred to the open coating area PA to be placed thereon.

As illustrated in FIG. 4, in the open coating area PA, a heat radiating coating is discharged (in the Z direction) to the substrate W from the spray nozzle 4, and the surface of the substrate W is thus coated with the heat radiating coating (second step). For example, of the entire surface of the substrate W, a surface of the substrate W that is not in contact with the surface of the coating area PA having the substrate W placed thereon is exposed, and the exposed surface is coated with a heat radiating coating. Alternatively, of the exposed surface, a region on which a coating is to be deposited is coated with a heat radiating coating.

As shown in FIG. 4B, the substrate W may have a fin structure F including a plurality of projections and recesses on its surface, and a heat radiating coating may be applied to the fin structure through spraying. For example, in order to increase the specific surface area, a fin structure that has a plurality of projections arranged at intervals therebetween can be formed.

Since a heat radiating coating is applied to the substrate through spraying as illustrated in the drawing, it is possible to stably form a heat radiating film on the surface of the substrate even when the surface of the substrate is not flat and has complex projections and recesses like a fin structure.

In addition, though not illustrated, the method of applying a heat radiating coating to the substrate W may be a method of applying a heat radiating coating to the surface of the substrate W by dropping it besides the method of applying a heat radiating coating to the surface of the substrate W through spraying using the spray nozzle 4 as illustrated in FIG. 4.

Specifically, such a method includes changing the drop position of a heat radiating coating while dropping it onto the substrate W or passing the substrate W below a heat radiating coating that is being dropped. Exemplary methods include a coating method such as curtain coating in which a heat radiating coating is applied by being dropped in a band-like (curtain-like) manner, or slot coating.

With the method of applying a heat radiating coating to a substrate through dropping, it is also possible to stably form a heat radiating film on the surface of the substrate even when the surface of the substrate is not flat and has complex projections and recesses like a fin structure.

When a heat radiating coating containing thermoplastic resin is applied to the substrate W, if polyamide-imide (PAI) is used as the heat radiating coating, the heat radiating coating is applied under the condition that the substrate W is at a temperature of greater than or equal to about 180° C. that is a temperature of greater than or equal to the deposition temperature of the heat radiating coating. Alternatively, the heat radiating coating is applied under the condition that the substrate W is at a temperature in the range of greater than or equal to about 180° C., which is greater than or equal to the deposition temperature (softening temperature) of the heat radiating coating, and less than a preset temperature that is higher than the deposition temperature by a predetermined temperature (for example, 280° C. that is the deposition temperature of 180° C. plus 100° C.). Meanwhile, if an epoxy coating or a phenolic coating is used as the heat radiating coating, the heat radiating coating is applied under the condition that the substrate W is at a temperature of greater than or equal to about 170° C., which is greater than or equal to the deposition temperature (curing temperature) of the heat radiating coating, and less than a preset temperature that is higher than the deposition temperature by a predetermined temperature (for example, 270° C. that is the deposition temperature of 170° C. plus 100° C.).

When molten aluminum is used as the molten metal Y, the temperature of the substrate W immediately after being molded is greater than or equal to the aforementioned deposition temperature of the heat radiating coating since the heat of the molten metal Y is about 700° C. Therefore, if the heat radiating coating is applied to the substrate while the temperature of the substrate, which has been released from the molding dies 10 and has a temperature decrease during transfer to the coating area PA, is greater than or equal to the deposition temperature of the heat radiating coating, the heat radiating coating is deposited by the heat of the substrate W and a heat radiating film is thus formed.

As described above, when a heat radiating coating is applied to the substrate W while the temperature of the substrate W is greater than or equal to the deposition temperature of the heat radiating coating, the heat radiating coating can be baked by the heat of the substrate W. Therefore, a baking furnace that has been needed in the baking step of the production method of the related art can be omitted and the baking step can be omitted, which can increase the production efficiency.

In addition, when a heat radiating coating is applied to the substrate W through spraying, volatilization of volatile components in the heat radiating coating partially occurs. Therefore, voids are unlikely to be formed in the heat radiating film, and a heat radiating film with an even more uniform thickness can be formed.

Further, when a heat radiating coating is applied to the substrate W through spraying, a heat radiating film with a surface roughness Ra as high as 5 μm or greater can be formed, and the specific surface area of the heat radiating film thus becomes large. Consequently, a heat sink with high heat radiation performance can be produced.

(Experiments of Verifying the Heat Radiation Performance of Heat Sinks and Results Thereof)

The inventors conducted experiments of verifying the heat radiation performance of heat sinks. As the test pieces, the following three heat sinks were produced: a heat sink made of only an aluminum substrate without a heat radiating film formed thereon (reference example); a heat sink formed by applying a heat radiating coating to the surface of an aluminum substrate through spraying and baking it using the temperature of the substrate to form a heat radiating film thereon (present example); and a heat sink formed by dipping an aluminum substrate in a heat radiating coating and performing baking treatment thereto to form a heat radiating film on the substrate (comparative example).

Figure 5:
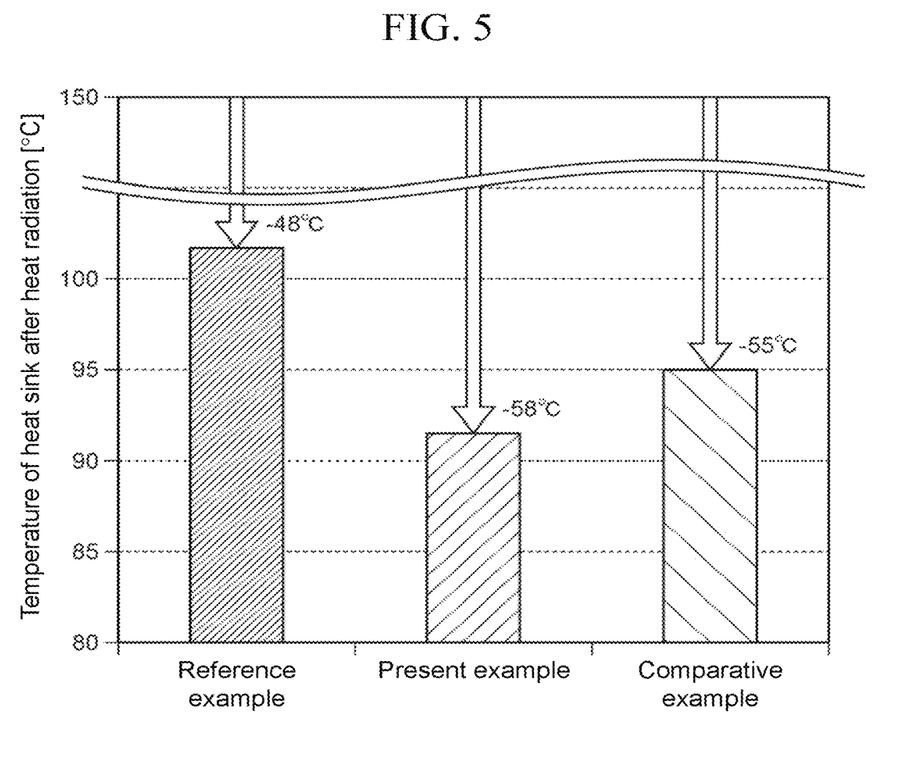
FIG. 5 is a graph illustrating the experimental results of verifying the heat radiation performance of heat sinks.

Each test piece was held at 150° C. and the temperature of the test piece after 15 minutes was measured. FIG. 5 illustrates the measurement results.

FIG. 5 can confirm that the heat radiation temperature of the reference example without a heat radiating film is 48° C. whereas the heat radiation temperature of the present example with a heat radiating film is 58° C. and the heat radiation temperature of the comparative example is 55° C., and thus that both the present example and the comparative example have improved heat radiation performance.

In addition, comparison between the comparative example and the present example reveals that the heat radiation temperature of the present example produced using the production method of the present disclosure is higher than that of the comparative example, and thus can confirm the advantageous effects of the production method of the present disclosure.

(Experiments of Verifying the Relationship Between the Heat Radiation Performance and the Temperature of a Substrate During Application of a Heat Radiating Coating Thereto with the Dilution Rate Changed, and Results Thereof)

Figure 6A:
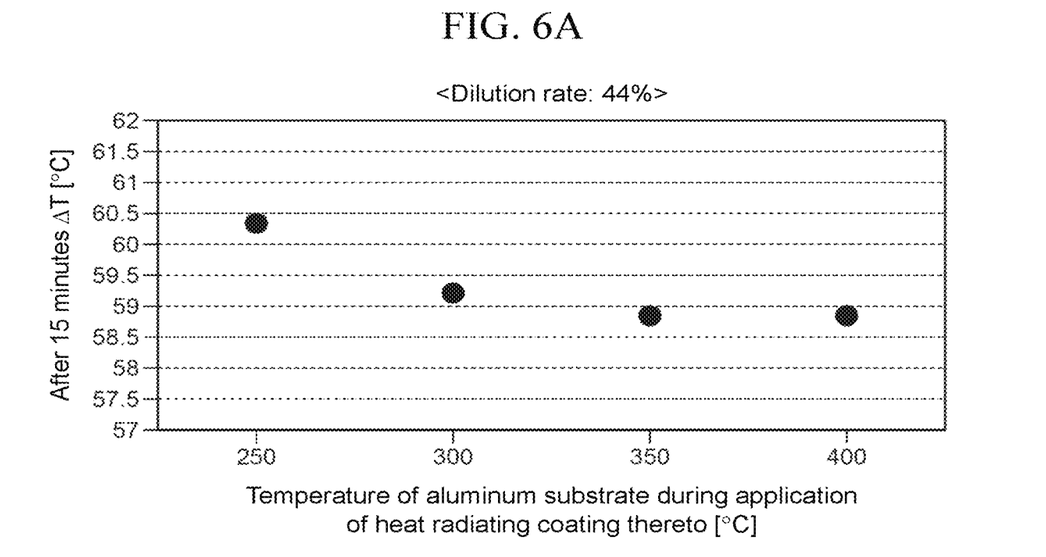
FIG. 6A is a graph illustrating the experimental results of verifying the relationship between the heat radiation performance and the temperature of a substrate during application of a heat radiating coating, which has been diluted by 44%, to the substrate.
Figure 6B:
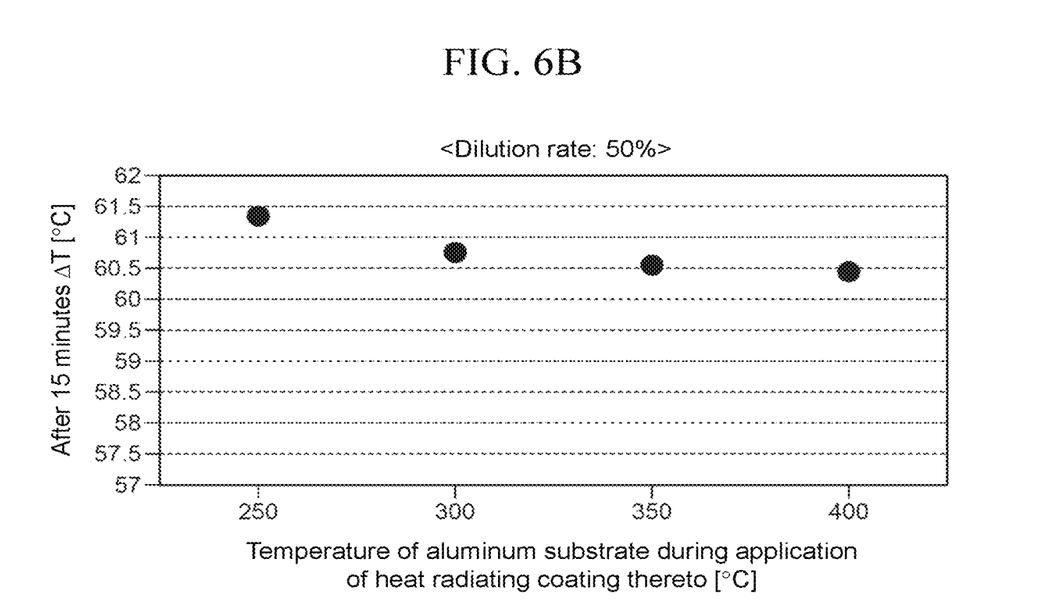
FIG. 6B is a graph illustrating the experimental results of verifying the relationship between the heat radiation performance and the temperature of a substrate during application of a heat radiating coating, which has been diluted by 50%, to the substrate.

The inventors conducted experiments of verifying the relationship between the heat radiation performance and the temperature of a substrate during application of a heat radiating coating thereto with the dilution rate changed. Specifically, regarding cases where NMP, which is an organic solvent, was diluted with polyamide-imide (PAI) at dilution rates of 44% and 50%, the heat radiation performance when the temperature of an aluminum substrate during application of the coating thereto was changed to 250° C., 300° C., 350° C., and 400° C. was verified. Herein, FIGS. 6A and 6B are graphs illustrating the experimental results of verifying the relationship between the heat radiation performance and the temperature of the substrate during application of a heat radiating coating thereto when the dilution rate of the coating was changed. Specifically, FIG. 6A illustrates a case where the dilution rate is 44% and FIG. 6B illustrates a case where the dilution rate is 50%.

FIGS. 6A and 6B can confirm the results that the heat radiation performance is superior when the dilution rate is 50% regardless of the temperature of the substrate during application of the coating thereto.

Figure 7:
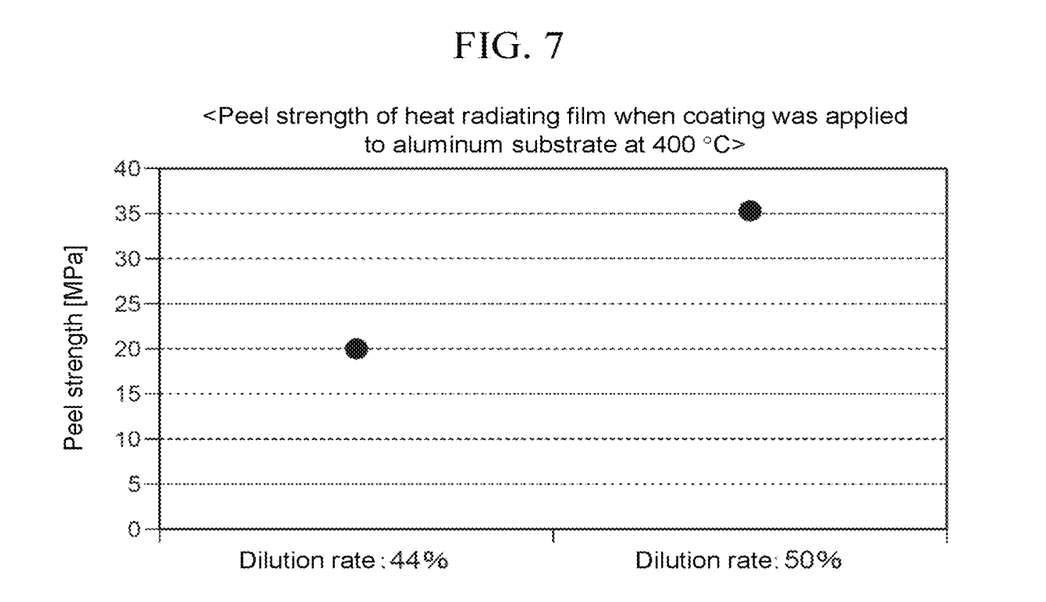
FIG. 7 is a graph illustrating the experimental results of verifying the peel strength of a heat radiating film when a heat radiating coating diluted by 44% or 50% was applied to a substrate.

FIG. 7 is a graph illustrating the experimental results of verifying the peel strength between a substrate and a heat radiating film when a temperature of the substrate is at 400° C. and a heat radiating coating diluted by 44% or 50% was applied to the substrate.

FIG. 7 can confirm that the peel strength is higher when the dilution rate is 50%.

Accordingly, the experimental results in FIGS. 6A, 6B, and 7 can confirm that the dilution rate of the heat radiating coating is preferably about 50%.

(Experiments of Verifying the Relationship Between the Heat Radiation Performance and the Transition Temperature of a Heat Radiating Coating and Results Thereof)

Figure 8:
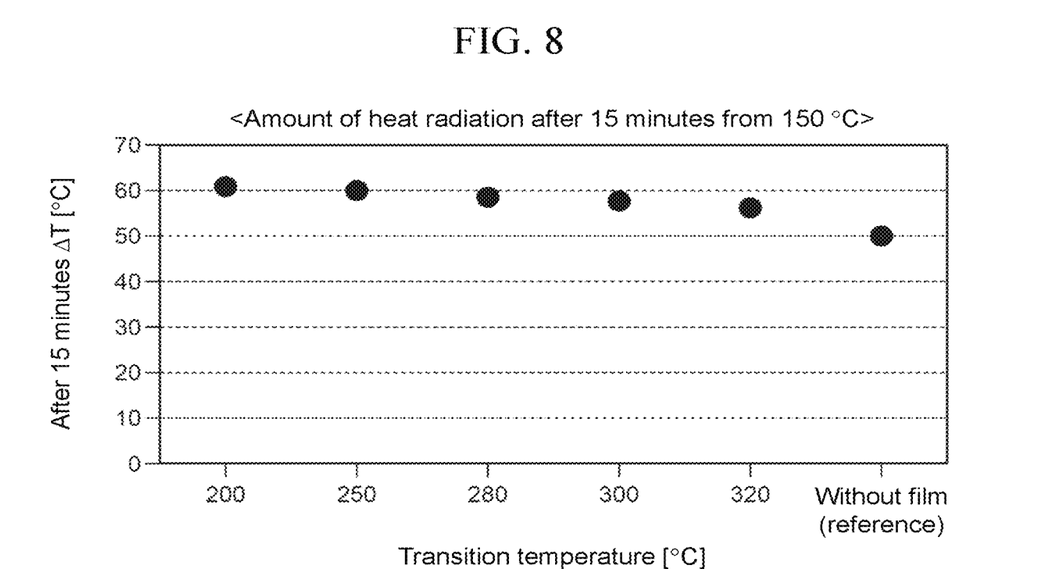
FIG. 8 is a graph illustrating the experimental results of verifying the relationship between the heat radiation performance and the transition temperature of a heat radiating coating.

The inventors conducted experiments of verifying the relationship between the heat radiation performance and the transition temperature of a heat radiating coating. Specifically, materials with transition temperatures of 200° C., 250° C., 280° C., 300° C., and 320° C. were prepared by using epoxy coatings and changing the compositions thereof, and verified the heat radiation performance of a test piece with a heat radiating film made of each material. FIG. 8 illustrates the experimental results.

FIG. 8 can verify that about the same degree of heat radiation performance can be obtained at all transition temperatures.

(Experiments of Verifying the Properties of the Interface Between a Substrate and a Heat Radiating Film and the Properties of the Surface of the Heat Radiating Film when Spraying and Dipping are Used, and Results Thereof)

Figure 9:
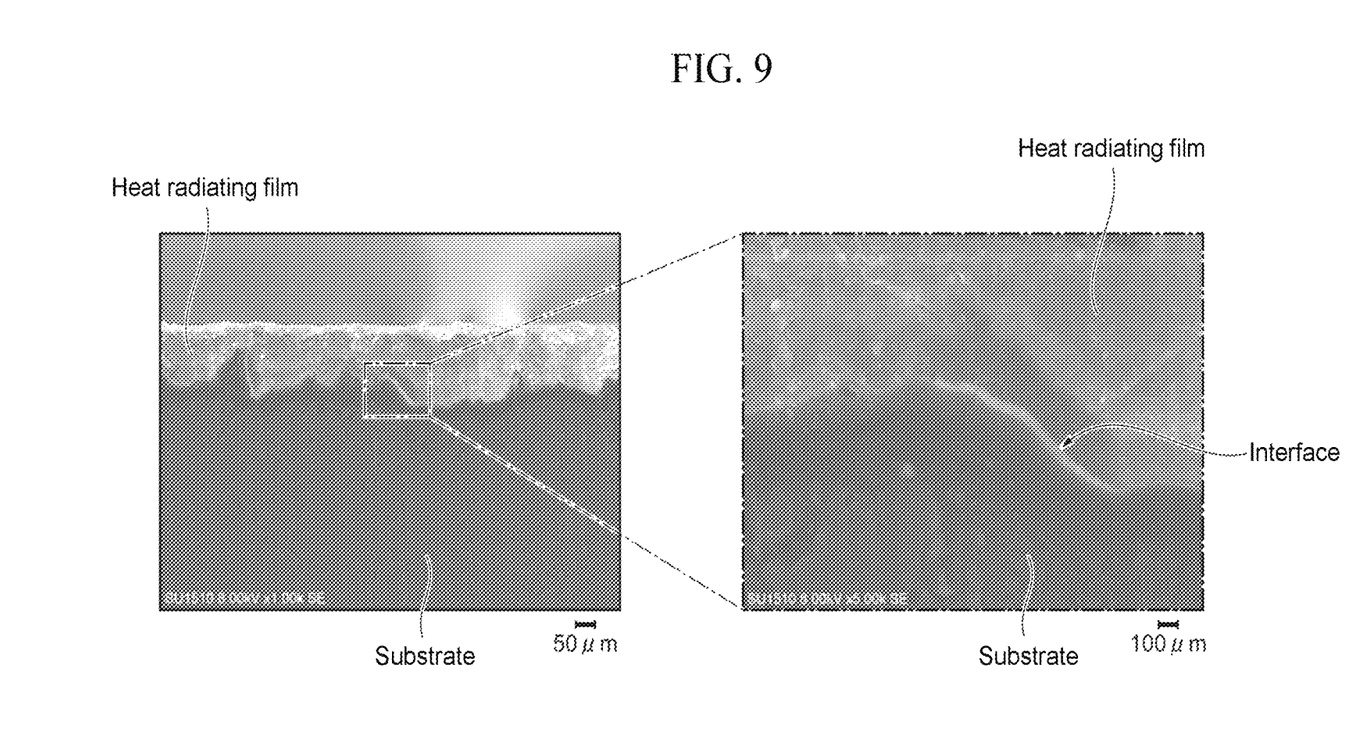
FIG. 9 illustrates SEM photographs of an area around the interface between a substrate and a heat radiating coating that has been formed by dipping the substrate in a heat radiating coating material and heating and baking it.
Figure 10:
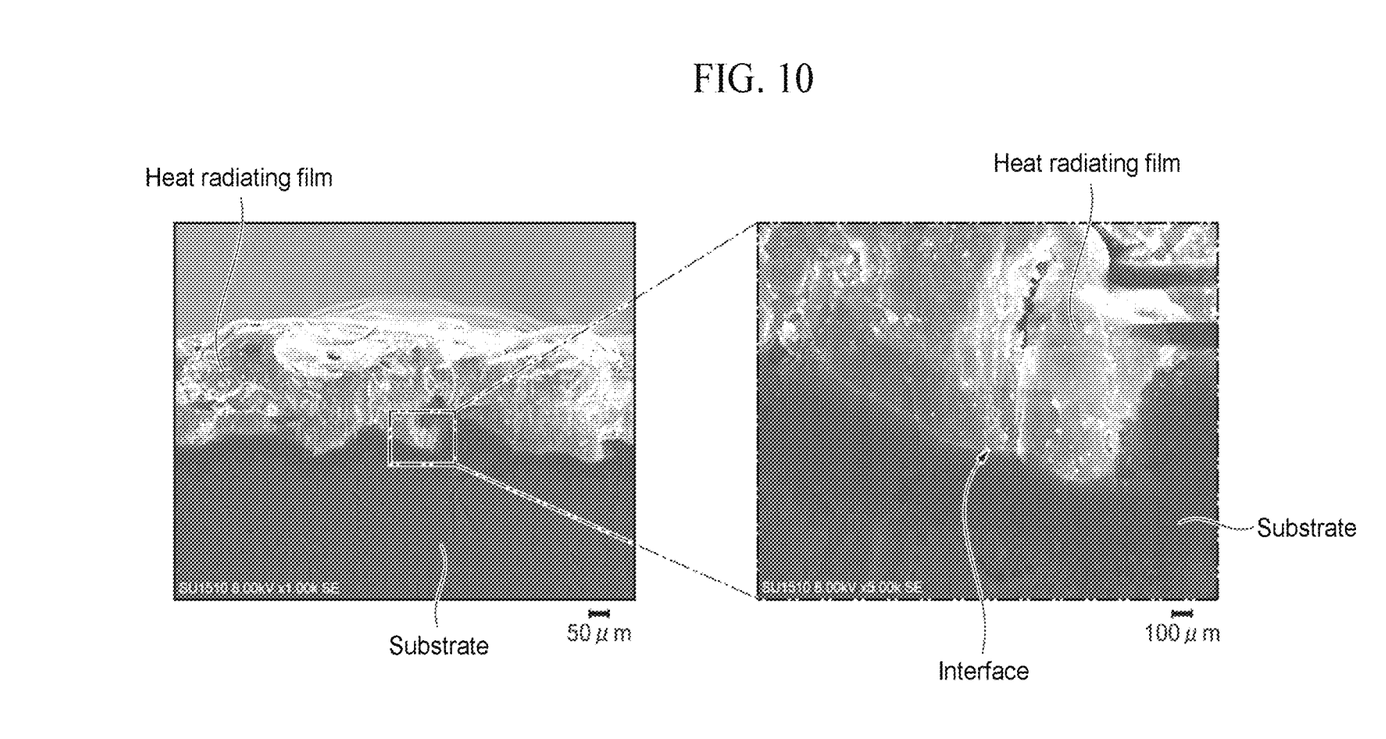
FIG. 10 illustrates SEM photographs of an area around the interface between a substrate and a heat radiating film that has been formed by heating the substrate, applying a heat radiating coating thereto through spraying, and baking it.

The inventors further conducted experiments of verifying the properties of the interface between a substrate and a heat radiating film and the properties of the surface of the heat radiating film when spraying and dipping were performed. Herein, FIG. 9 illustrates SEM photographs of an area around the interface between a substrate and a heat radiating coating that has been formed by dipping the substrate in a heat radiating coating material and heating and baking it. FIG. 10 illustrates SEM photographs of an area around the interface between a substrate and a heat radiating film that has been formed by heating the substrate, applying a heat radiating coating thereto through spraying, and baking it.

Comparison between FIGS. 9 and 10 can confirm that the regarding the properties of the surface of the heat radiating film, the surface of the heat radiating film in FIG. 10 formed through spraying has higher roughness. That is, the SEM photographs can also confirm that a heat radiating film formed through spraying has higher surface roughness and thus has superior heat radiation performance.

In addition, regarding the properties of the interface between the substrate and the heat radiating film, it can be confirmed that projections and recesses on the interface between the substrate and the heat radiating film in FIG. 10 formed through spraying are rough. That is, the SEM photographs can also confirm that projections and recesses on the interface between the heat radiating film and the substrate formed through spraying are rough and thus that the peel strength is increased due to the anchor effect.

Although the embodiments of the present disclosure have been described in detail with reference to the drawings, specific configurations are not limited thereto and any changes and the like that are within the spirit and scope of the present disclosure are all included in the present disclosure. Although the aforementioned embodiments of the present disclosure illustrate a configuration in which a heat radiating coating is applied to the substrate W while the substrate W is placed in the coating area PA, the present disclosure is not limited to such embodiments. For example, a surface to be coated of the substrate W may be coated while a part of the substrate W is held by the robot hand 20. Alternatively, for example, a surface to be coated of the substrate W may be coated while the substrate W is left in a part of the molding dies (for example, one of the first die 1 or the second die 2) immediately after the dies are opened, and the surface to be coated is thus exposed.

DESCRIPTION OF SYMBOLS

1 First die
1a Substrate extruder
2 Second die
2a Injection hole
2b Molten metal extruder
4 Spray nozzle
5 Coating storage container
10 Molding dies
20 Robot hand (transfer apparatus)
30 Coating applicator
100 Production System (for heat sink)
C Cavity
PA Coating area
W Substrate
Y Molten metal

What is claimed is:

1. A method for producing a heat sink having a substrate and a heat radiating film formed on a surface of the substrate, comprising:

a first step of casting a substrate by injecting molten metal into a cavity of molding dies; and a second step of applying a heat radiating coating to a surface of the substrate to be coated through spraying or dropping in a period from when the molding dies are opened after the casting until when a temperature of the substrate that has been cast becomes lower than a deposition temperature that is a temperature necessary to deposit the heat radiating coating on the substrate, wherein the heat radiating coating is applied to the surface of the substrate to be coated while the substrate is left in a part of the molding dies immediately after the molding dies are opened, and the surface of the substrate to be coated is thus exposed, and wherein the heat radiating coating is baked by heat of the surface of the substrate.

2. The method for producing a heat sink according to claim 1, wherein:

the surface of the substrate molded through the casting in the first step has a fin structure, and in the second step, the heat radiating coating is applied to the fin structure of the substrate through spraying or dropping.

3. The method for producing a heat sink according to claim 1, wherein:

the temperature of the substrate when the heat radiating coating is applied thereto in the second step is in a range of greater than or equal to the deposition temperature of the heat radiating coating and less than a preset temperature that is higher than the deposition temperature by a predetermined temperature.

4. The method for producing a heat sink according to claim 3, wherein:

the heat radiating coating contains thermosetting resin, the deposition temperature is defined as a curing temperature at which the thermosetting resin cures, and the temperature of the substrate when the heat radiating coating is applied thereto in the second step is in a range of greater than or equal to the curing temperature and less than a preset temperature that is higher than the curing temperature by a predetermined temperature.

5. The method for producing a heat sink according to claim 3, wherein:

the heat radiating coating contains thermoplastic resin, the deposition temperature is defined as a softening temperature at which the thermoplastic resin softens, and the temperature of the substrate when the heat radiating coating is applied thereto in the second step is in a range of greater than or equal to the softening temperature and less than a preset temperature that is higher than the softening temperature by a predetermined temperature.

6. The method for producing a heat sink according to claim 1, wherein a surface roughness Ra of the heat radiating film formed is greater than or equal to 5 μm.

7. The method for producing a heat sink according to claim 1, wherein the method is free of a baking step in a baking furnace.

* * * * *